US006657212B2

United States Patent
Komori et al.

(10) Patent No.: US 6,657,212 B2
(45) Date of Patent: Dec. 2, 2003

(54) ELECTRON BEAM MEASUREMENT METHOD AND ELECTRON BEAM IRRADIATION PROCESSING DEVICE

(75) Inventors: Minoru Komori, Yokohama (JP); Masanoru Yamaguchi, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 293 days.

(21) Appl. No.: 09/725,270

(22) Filed: Nov. 29, 2000

(65) Prior Publication Data

US 2001/0015412 A1 Aug. 23, 2001

(30) Foreign Application Priority Data

Nov. 29, 1999 (JP) .......................... 11-337788

(51) Int. Cl.[7] .............................................. H01J 37/00
(52) U.S. Cl. .................................................. 250/492.3
(58) Field of Search ............................ 250/492.3, 397

(56) References Cited

U.S. PATENT DOCUMENTS

| | | | |
|---|---|---|---|
| 3,418,155 A | * 12/1968 | Colvin et al. | 427/551 |
| 3,497,762 A | * 2/1970 | Reed | 315/383 |
| 3,784,909 A | 1/1974 | Schutt et al. | |
| 4,086,491 A | 4/1978 | Vaughan | 250/397 |
| 5,440,210 A | * 8/1995 | Bogaty et al. | 315/383 |
| 5,612,588 A | 3/1997 | Wakalopulos | |
| 5,644,220 A | 7/1997 | Urs et al. | |
| 6,140,657 A | * 10/2000 | Wakalopulos et al. | 250/492.3 |
| 6,429,444 B1 | * 8/2002 | Korenev et al. | 250/492.3 |

FOREIGN PATENT DOCUMENTS

| | | |
|---|---|---|
| GB | 1717608 | 11/1969 |
| GB | 1380126 | 1/1975 |
| JP | 57-063463 | 4/1982 |
| JP | 03-072290 | 3/1991 |
| JP | 11-248893 | 9/1999 |

OTHER PUBLICATIONS

Examiner: E. Van den Bulcke, European Search Report, Date of Search: Feb. 16, 2001, 3 Pages, Place of Search: The Hague.

* cited by examiner

Primary Examiner—John R. Lee
Assistant Examiner—Johnnie L Smith, II
(74) Attorney, Agent, or Firm—Nixon Peabody, LLP; David S. Safran

(57) ABSTRACT

An electron beam irradiation processing device including an electron beam tube and a current detection unit disposed outside of the window of the electron beam tube. The electron beam tube is adapted to radiate electron beams and has a window and an associated power-source unit that provides a power source. The current detection unit includes at least one of a conductor and a semiconductor covered by an insulating film, and an electron beam level measurement unit having a current measurement unit that measures the current flowing through the current detection unit. The amount of electron beams output from the electron beam tube is controlled by controlling the power-source unit as a function of the current flowing through the current detection unit. In addition, a method of measuring amount of electron beams radiated from an electron beam tube with a window including the steps of providing a current detection unit and measuring amount of electron beams radiated from the electron beam tube by measuring the current flowing through the current detection unit.

10 Claims, 8 Drawing Sheets

A diagram showing the structure of a control device of an electron beam tube in an embodiment of the present invention.

A diagram showing the structure of a control device of an electron beam tube in an embodiment of the present invention.

A diagram showing an example of the disposition of a current detection unit.

A diagram showing the structure of an experimental circuit.

A diagram showing the current measured when a stainless wire is coated with a ceramic film and when it is not coated.

A diagram showing the output when the power of an EB tube is controlled by measuring the amount of electron beams using an electron beam level measurement unit and when the power of an EB tube is controlled by detecting the tube current.

A diagram showing an example of the structure of a control system when using a plurality of EB tubes.

A diagram showing the approximate structure of an EB tube with a window and of its power source circuit.

A diagram explaining the disposition of the window of an EB tube.

ELECTRON BEAM MEASUREMENT METHOD AND ELECTRON BEAM IRRADIATION PROCESSING DEVICE

BACKGROUND OF THE INVENTION

1. Field of Invention

The present invention relates to an electron beam measurement method that measures the amount of electron beams radiated from a vacuum tube type of electron beam tube that is used in curing resists applied to semiconductor wafers, etc. and in drying ink applied to various types of printed material. The present invention also relates to an electron beam irradiation processing device that processes aforementioned processed material by irradiating it with electron beams.

2. Description of Related Art

The use of electron beam irradiation has been proposed to cure resists applied to semiconductor wafers as well as to dry or cure paint, ink, adhesive, protective resin, etc., applied to substrates.

In recent years, electron beam tubes provided with a window have been marketed. The structure of such electron beam tubes comprises a thermo-ionic unit and an electron beam acceleration unit mounted in a vacuum container provided with a window which is permeable to electron beams. The thermo-ionic electrons radiated from the thermo-ionic unit are accelerated by an electron beam acceleration unit and radiated.

Electron beams are radiated into the atmosphere from the window when such an electron beam tube is used. Conventional electron beam irradiation processing devices have depressurized the atmosphere in which the irradiated material is disposed. However, this is unnecessary when using aforementioned electron beam tube thereby eliminating the need for vacuum pumps and vacuum chambers for depressurization, and consequently, simplifying the structure of the electron beam irradiation processing device.

FIG. 7 is a diagram that shows the diagrammatic structure of a vertical type of electron beam tube provided with a window (hereinafter abbreviated EB tube) and its power source circuit.

EB tube 1 is provided with filament 1a and grid 1b. High voltage of 30 to 70 kV, for example, is applied to filament 1a and grid 1b from direct current high-voltage power source 2 via terminal 1f. Furthermore, filament power source 3 is connected to filament 1a via terminal 1f. Filament 1a is heated by current that is provided from said filament power source 3 and thermo-ionic electrons are radiated. Electrons that are radiated are arranged in beam shape by an electric field that is created by grid 1b. In addition, grid power source 4 is connected to grid 1b via terminal 1f and electron emission from grid 1b can be controlled by controlling the voltage that is applied to grid 1b.

The arranged electron beam (hereinafter termed "electron beam") is output outside of EB tube 1 from window 1d that is set in flange 1c. The electron beams that are output from EB tube 1 are irradiated on processed material such as semiconductor wafers that are not illustrated or on various types of printed material to complete curing of resists or drying of ink, etc.

EB tube 1 has a sealed structure comprising quartz tube wall 1e, flange 1c and window 1d. The internal pressure is depressurized to $10^{-4}$ to $10^{-6}$ Pa ($10^{-6}$ to $10^{-8}$ Torr) to ensure that the electron beams that were created are not attenuated.

Window 1d is a film of special material containing silicon of several $\mu$m thickness (for example, 3 $\mu$m) to ensure that the electron beams are not attenuated while passing through the window 1d.

The electron beams that are created can be output outside of EB tube 1 more efficiently by enlarging the area of window 1d. However, the window is extremely thin (several $\mu$m), as indicated above, and it must serve as a partition between the atmospheric pressure outside of EB tube 1 and the pressure ($10^{-4}$ to $10^{-6}$ Pa) within EB tube 1. Accordingly, the area of one window cannot be too large because of the danger of breakage. Thus, a plurality of windows, each having a small area with a size of 1 to 2 mm per side, are aligned in the longitudinal direction of the filament so as to match the shape of the electron beams, as shown in FIG. 8.

A prescribed amount of electron beams must be irradiated onto processed material when processing the processed material (workpiece) using electron beams that are output from EB tube 1. If the processed material is not irradiated with the prescribed amount of electron beams and the amount of irradiation is inadequate or excessive, the processing of the processed material would fail.

The following two methods of outputting a fixed amount of electron beams have been available. Both effect controls so that a fixed amount of power is provided to EB tube 1.

[1] Method of control in which the tube current is detected and controlled so as to be constant. This is a method in which the tube current (the current flowing from direct current high-voltage power source 2 to EB tube 1 in FIG. 7, denoted by broken line in the diagram) is detected by current detection unit 5 and is controlled so as to be constant by controlling the current flowing through filament 1a, as shown in FIG. 7. This is control in which the power supplied to EB tube 1 is kept constant by holding the tube current constant so long as the voltage of direct current high-voltage power source 2 is constant. This method is usually used in X-ray tubes.

[2] Method in which the filament input power is held constant. This is a method in which the power input to filament 1a is controlled to be constant by controlling the current (and the voltage of filament 1a) that flows through filament 1a. The amount of thermo-ionic electrons that are emitted is controlled by controlling the power of filament 1a to be constant. More specifically, the tube current is controlled to be constant and the power supplied to EB tube 1 is held constant. Despite the control methods described above, the amount of electron beams output from EB tube 1 changes even if the tube current is controlled to be constant and a fixed level of power is supplied to EB tube 1, as shown in FIG. 7. The present inventors believe that the reasons for this are follows:

[1] Filament 1a and grid 1b within EB tube 1 are fixed within so that their positions would not change. However, the shapes of the filament 1a and of the nearby grid 1b change due to thermal expansion since the temperature of the heated filament reaches about 1900° C. during thermo-ionic electron output.

[2] The shape and direction of the electron beams change due to the effects of the electrostatic charge that develops within the tube.

As mentioned above, window 1d that captures electron beams outside of EB tube 1 comprises a set of windows about 1 mm wide, each aligned in the longitudinal direction of the filament. Accordingly, electron beams are emitted beyond window 1d when the shape and direction of the generated electron beams change within EB tube 1 for aforementioned reasons [1] and [2], and those electron beams are no longer captured. As a result, the amount of output electron beams changes.

Accordingly, the present inventors believe that even if EB tube 1 could be controlled so that a constant power would be provided, the amount of electron beams output from EB tube 1 could not be held constant.

Therefore, there exists an unfulfilled need for an electron beam irradiation processing device and a method of control thereof that overcomes the above noted disadvantages.

SUMMARY OF THE INVENTION

The present inventors have found that the amount of electron beams could be controlled to be constant if the power supplied to EB tube 1 could be controlled in a manner that the amount of electron beams output from EB tube 1 were constant by measuring this electronic beam output from the EB tube 1. However, no method of accurately measuring the amount of electron beams output from EB tube 1 had been available. In particular, the atmospheric gases turn into plasma as a result of electron beam irradiation, resulting in secondary electron emission from the processed material, the workpiece stage upon which the processed material is set, and the walls of the processing chamber, etc. For such reasons, even if a sensor and the like were disposed near window 1d of EB tube 1 to detect the amount of electron beams, the amount of electron beams output from EB tube 1 could not be accurately and stably detected due to the effects of the floating charge attributable to aforementioned secondary electrons.

The present invention has been devised in light of the problems associated with conventional technology as discussed previously and above. In this regard, the first object of the present invention is to provide an electron beam measurement method capable of accurately measuring the amount of electron beams output from an electron beam tube to the processed material. The second object is to provide an electron beam irradiation processing device capable of controlling and holding constant, the amount of electron beams irradiated onto processed material by controlling and holding constant, the amount of electron beams output from an electron beam tube.

In accordance with the preferred embodiments of the present invention, the above objects are attained by:

(1) A current detection unit comprising a conductor or a semiconductor covered by an insulating film is disposed on the outside of the window of an electron beam tube and the amount of electron beams radiated from the electron beam tube is measured by measuring the current flowing through the current detection unit.

(2) A current detection unit comprising a conductor or a semiconductor covered by an insulating film, and a measurement unit for measuring the amount of electron beams comprising a current measurement unit that measures the current flowing through the current detection unit. These are disposed on the outside of the window of an electron beam tube to thereby allow measuring of the amount of electron beams output from the electron beam tube. The amount of electron beams irradiated onto the processed material can then be held constant by controlling the power source unit as a function of the current signal flowing through the current detection unit.

In accordance with one embodiment of the present invention, a current detection unit comprising a conductor or a semiconductor covered by an insulating film is disposed as mentioned above. The aforementioned insulating film forms an energy barrier and the amount of electron beams radiated from the electron beam tube can be measured by measuring the current following through the current detection unit. Accordingly, the generation of current through capture of the floating charge (i.e. the above noted secondary electron emission) by the aforementioned semiconductor or conductor can be prevented. For this reason, the current due only to electrons output that is generated from the electron beam tube can be detected, and electron beams output from the electron beam tube can be accurately measured.

Furthermore, the amount of electron beams output from an electron beam tube can be controlled without being affected by a floating charge. The amount of electron beams output from the electron beam tube can be controlled by applying aforementioned method of measuring the amount of electron beams to an electron beam irradiation processing device. Moreover, a fixed level of electron beams could be stably output even if the shape or direction of electron beams within the electron beam tube should change.

For this reason, processed material could be irradiated with a set, prescribed amount of electron beams, and processing failure due to insufficient or excessive irradiation could be prevented.

DETAILED DESCRIPTION OF THE PREFERRED EMBODIMENT

Figure 1:
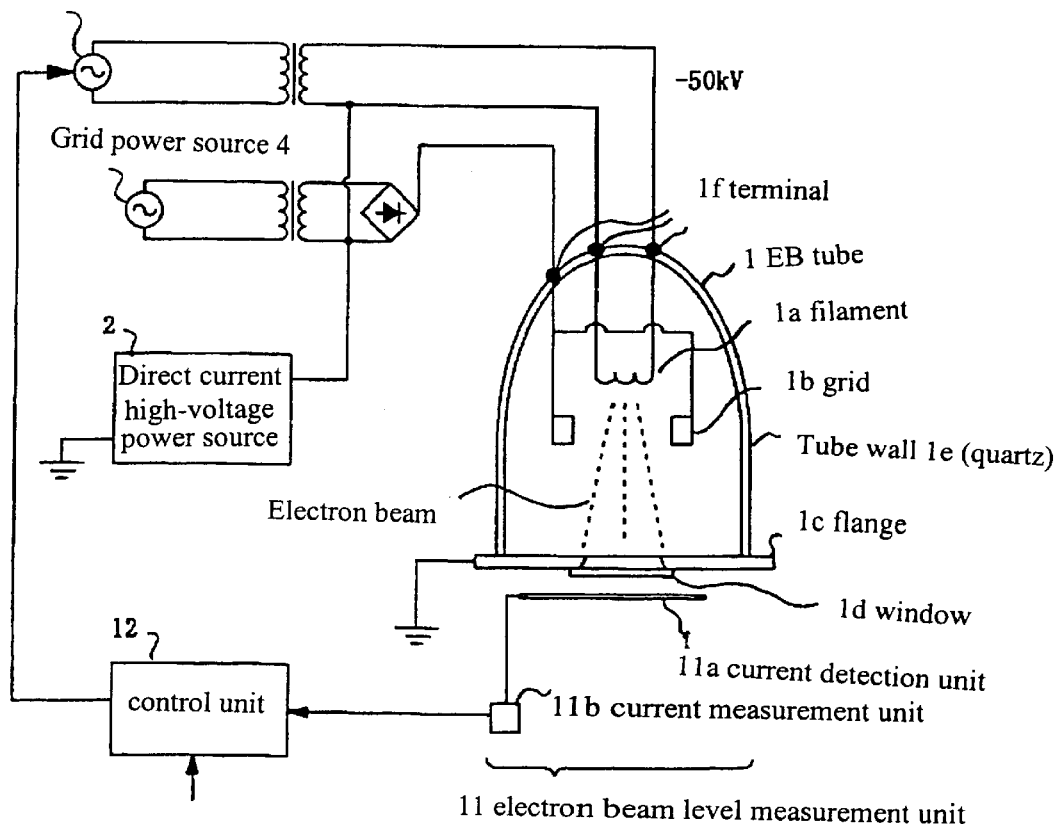
FIG. 1 is a schematic diagram showing the structure of a control device of an electron beam tube in accordance with one embodiment of the present invention.

FIG. 1 is a schematic diagram showing one embodiment of the present invention. EB tube 1 has filament 1a and grid 1b disposed therewithin, just as in aforementioned prior art EB tube of FIG. 7. High voltage of 30 to 70 kV, for example, is applied to filament 1a and grid 1b from direct current high-voltage power source 2. Furthermore, filament power source 3 is connected to filament 1a via terminal 1f, and filament 1a is heated by current supplied from filament power source 3, thereby radiating thermo-ionic electrons. The electrons that are radiated are arranged into beam shape by an electric field created by grid 1b. Furthermore, grid power source 4 is connected to grid 1b via terminal 1f, and thermion radiation can be controlled by controlling the voltage that is applied to grid 1b. The shaped electron beams are output through window 1d that is set in flange 1c outside of EB tube 1.

In contrast with the prior art, the present invention is provided with an electron beam level measurement unit 11 including a current detection unit 11a which is mounted near the outside (distance of approximately 5 mm from the window) of window 1d of the EB tube 1. Current detection unit 11a comprises a conductor such as stainless steel, copper, aluminum, or such semiconductors as silicon, germanium, compound semiconductors. Current measurement unit 11b comprises an ammeter that measures the current that was detected and a current-voltage converter circuit.

Part of the electron beams that are output from window 1d of EB tube 1 are captured by current detection unit 11a. The captured electrons move through current detection unit 11a and generate current. The generated current is measured by current measurement unit 11b, is converted into a voltage signal that shows the measured current, and is then fed to control unit 12.

Control unit 12 compares aforementioned measured current with a set current level that had been input in advance. If the measured current is lower than the set current level, the tube current is increased by controlling the filament power source 3 and the power supplied to EB tube 1 is increased. In a similar manner, if the measured current is greater than the set current level, the power supplied to EB tube 1 is reduced by decreasing the tube current by controlling the filament power source 3.

In this manner, the electron beams that are output from window 1d of EB tube 1 are detected as current and the power supplied to EB tube 1 is based on this current and may be controlled. Such control thereby permits constant and stable control of the amount of electron beams output from EB tube 1. FIG. 1 shows an embodiment in which filament power source 3 is controlled by the output of electron beam level measurement unit 11. However, the voltage applied to grid 1b is subjected to PWM control, as mentioned below, with the result being that the amount of electron beams that is output from EB tube 1 can be thus controlled.

Figure 2:
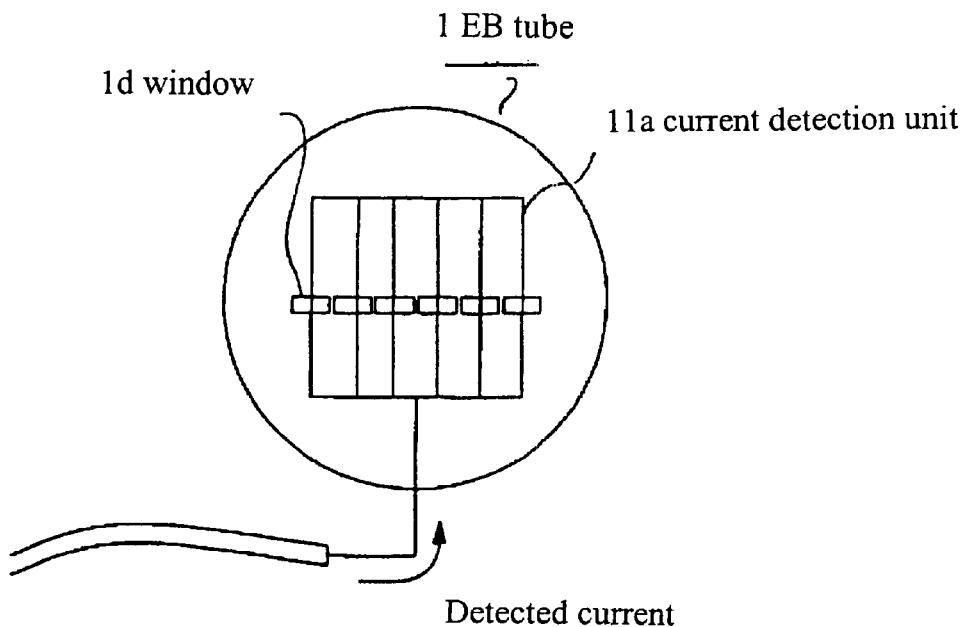
FIG. 2 is a schematic diagram showing an example of the disposition of a current detection unit in accordance with one embodiment of the present invention.

FIG. 2 is a diagram showing the layout of aforementioned current detection unit. In this diagram, current detection unit 11a is composed of a plurality of conductor wires, each of which is preferably disposed in the roughly orthogonal direction relative to the longitudinal direction (direction of alignment of window 1d) near each window 1d of EB tube 1. Even if the position of current detection unit 11a should shift somewhat, the effects would be minimized by adopting such a disposition and electron beam irradiation would not be obstructed.

When electrons are captured by current detection unit 11a shown in FIG. 2, the electrons flow through the conductor of current detection unit 11a and the size of the current is proportional to the amount of electrons captured by current detection unit 11a. The direction of the current becomes the direction shown in the diagram since current is created by the capture of electrons.

The following measures should preferably be considered in order to stabilize the current detected by current detection unit 11a.

Current detection unit 11a would preferably capture only the electron beams that are output from window 1d of EB tube 1. However, a charge that is created by electron beam irradiation near current detection unit 11a floats and the current detection unit 11a may also undesirably capture this charge as well.

Aforementioned charge is believed to be created for the following reasons:

[1] The atmospheric gases are turned into plasma due to electron beam irradiation.

[2] Secondary electrons are emitted from the electron beam level measurement unit 11 and from the workpiece stage upon which the processed material is laid (not illustrated) as well as from the walls of the processing chamber in which the workpiece stage is disposed.

If the processed material is not nearby, the floating charge near current detection unit 11a would be captured by current detection unit 11a. Conversely, if the processed material is nearby, the charge would be attracted to the processed material and it would not be captured by current detection unit 11a. Specifically, the size of the current that is measured by current measurement unit 11b would vary greatly depending on whether or not any processed material is present.

As indicated above, the amount of electron beams that is output from EB tube 1 cannot be accurately measured and the amount of electron beams output from EB tube 1 cannot be stably controlled unless the amount of electron beams is measured in a manner that eliminates the effects of aforementioned floating charge.

Usually, the electron beam energy output from EB tube 1 is several dozen kV while the floating charge energy is several dozen eV. However, the current flowing through current detection unit 11a increases with increase in aforementioned floating charge since the charge created at current detection unit 11a remains the same when electrons are captured, regardless of the magnitude of the energy.

Thus, the preferred embodiment of the present invention is designed so that current detection unit 11a of electron beam level measurement unit 11 captures only electrons having great energy that are output from the EB tube by utilizing the difference between the electron beam energy that is output from aforementioned EB tube 1 and the magnitude of the energy of the floating charge.

Specifically, the conductor surface of current detection unit 11a is coated with insulation. The type and thickness of the coating are selected so as to form an energy barrier such that several dozen keV electrons transit while obstructing the transit of several eV of charge. Alumina ($Al_2O_3$), silica ($SiO_2$), etc., could be used as the insulation.

Using stainless wire as current detection unit 11a of the electron beam level measurement unit 11, the individual currents were measured with an uncoated stainless wire and a ceramic coated wire coated with a ceramic film ($Al_2O_3$.15 $\mu$m thickness).

Figure 3:
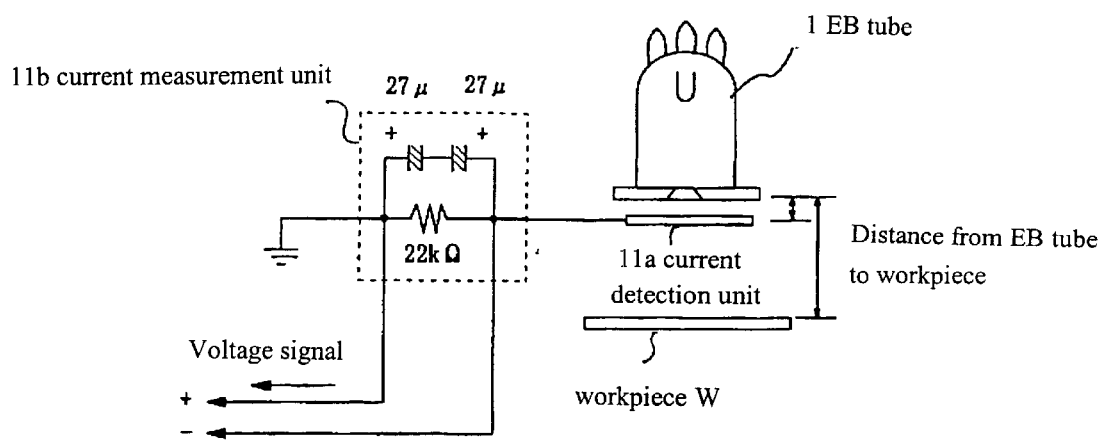
FIG. 3 is a schematic diagram showing the structure of a circuit used during experimentation with the present invention.

FIG. 3 is a schematic diagram showing the structure of an experimental circuit used during experimentation with the present invention. Current detection unit 11a of the electron beam level measurement unit 11 is disposed at a position 5 mm away from window 1d of EB tube 1, and workpiece W (a wafer was used here) is disposed below window 1d of EB tube 1. The current flowing through current detection unit 11a is measured by current measurement unit 11b while altering the distance between EB tube 1 and workpiece W. Workpiece W is laid on workpiece stage (not shown) which may be composed of a conductor and is grounded. The power supplied to EB tube 1 is 50 kV•200 $\mu$A, and the atmosphere is atmospheric pressure•air.

Figure 4:
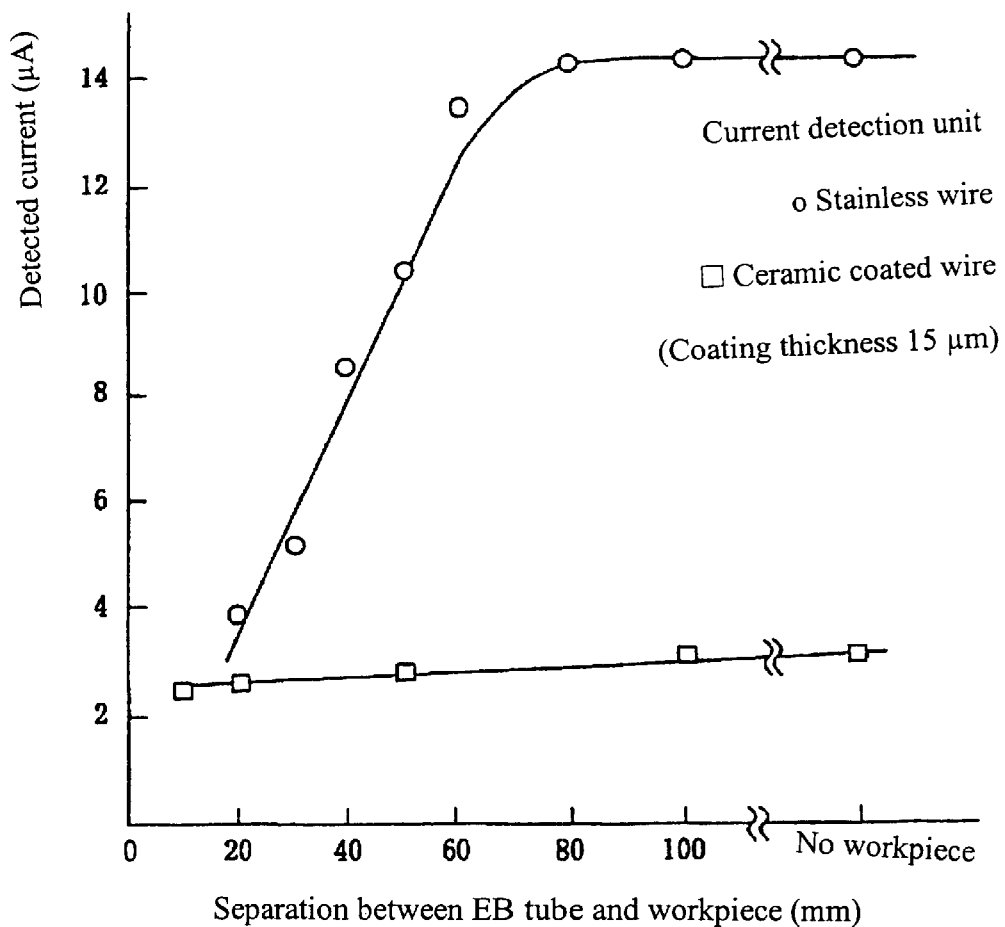
FIG. 4 is a graph showing the current measured with an uncoated stainless wire and a ceramic coated wire.

FIG. 4 is a graph showing the aforementioned current measured with an uncoated stainless wire and a ceramic coated wire. The abscissa represents the distance from the window of EB tube to the surface of the wafer which is workpiece W while the ordinate represents the current ($\mu$A) detected by current detection unit 11a. The round marks represent the case using uncoated stainless wire as current detection unit 11a while the square marks represent the case using stainless wire that is coated by aforementioned ceramic film of 15 $\mu$m thickness as the current detection unit 11a.

The current that is detected decreases as the wafer (workpiece W) approaches EB tube 1. The reason for this, as mentioned above, is believed to be that the charge floating near the electron beam level measurement unit is captured on the wafer as the wafer is approached.

On the other hand, if current detection unit 11a is coated by a ceramic of 15 $\mu$m thickness, the current that is detected remains virtually unchanged and is nearly independent of the extent to which the wafer is approached.

The ceramic coating film of $Al_2O_3$ about 15 $\mu$m thick corresponds to an energy barrier of about 30 keV. For this reason, current detection unit 11a is capable of detecting current due only to electrons having energy of 30 keV or more that are output from EB tube 1 without being affected by the charge floating near current detection unit 11a.

The aforementioned experiments demonstrate that the amount of electron beams can be measured accurately without being affected by the floating charge if the conductor of current detection unit 11a is coated by a ceramic of 15 $\mu$m thickness. Specifically, the floating charge is several dozen eV, as mentioned above, and a ceramic coating thick enough to prevent a floating charge of several dozen eV from transiting may be applied.

As indicated above, the amount of electron beams can be controlled (preferably without being affected by the floating charge) as a result of mounting electron beam level measurement unit 11, measuring the amount of electron beams, and controlling the power of EB tube 1. In addition, fluctuation in the output of EB tube 1 due to the effects of thermal expansion brought about by heating of the filament and the effects of static electricity within the tube walls can be prevented as well. The amount of electron beams output from EB tube 1 can thus, be held constant.

Figure 5:
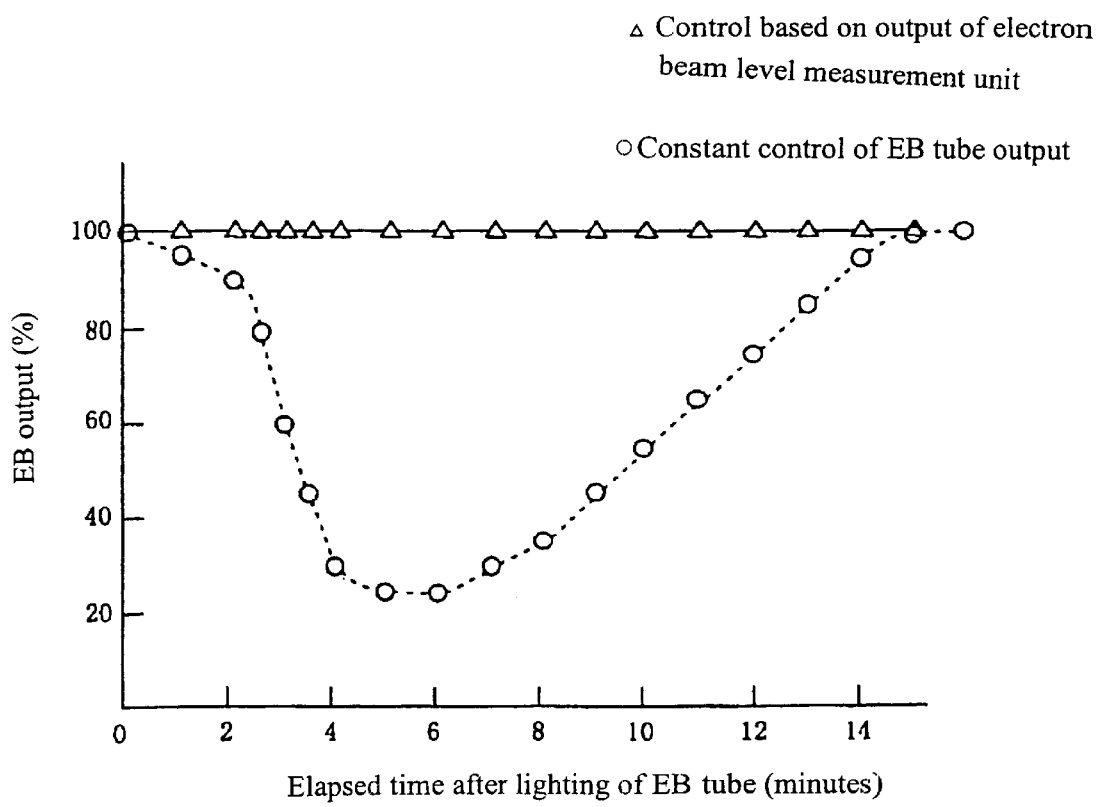
FIG. 5 is a graph showing the output when the power of an EB tube is controlled by measuring the amount of electron beams using an electron beam level measurement unit and when the power of an EB tube is controlled by detecting the tube current.
Figure 7:
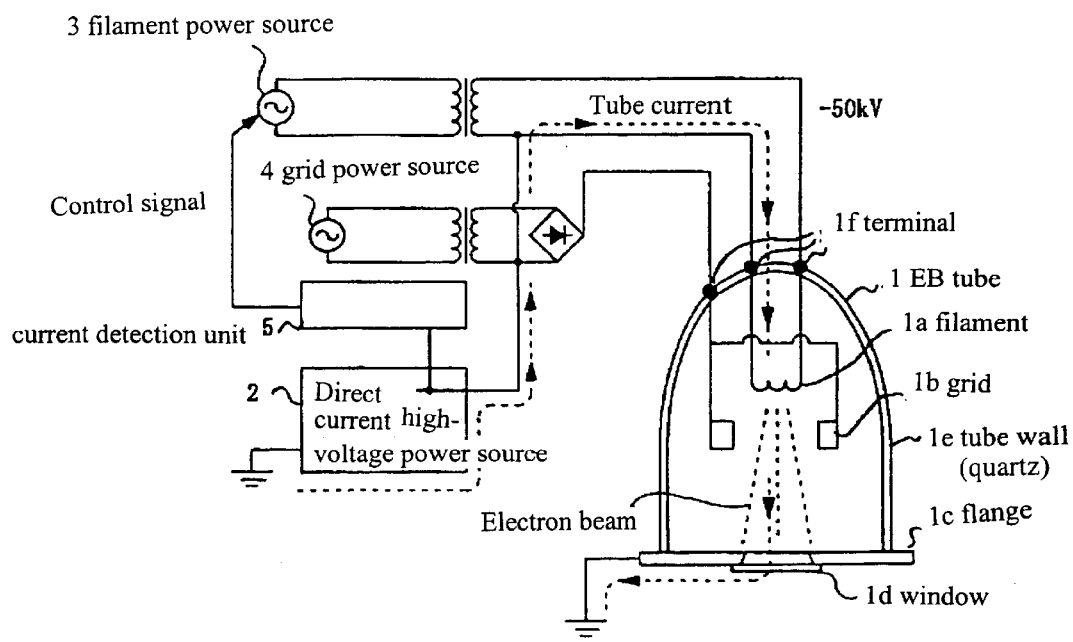
FIG. 7 is a schematic diagram showing the approximate structure of a prior art EB tube with a window, and its power source circuit.
Figure 8:
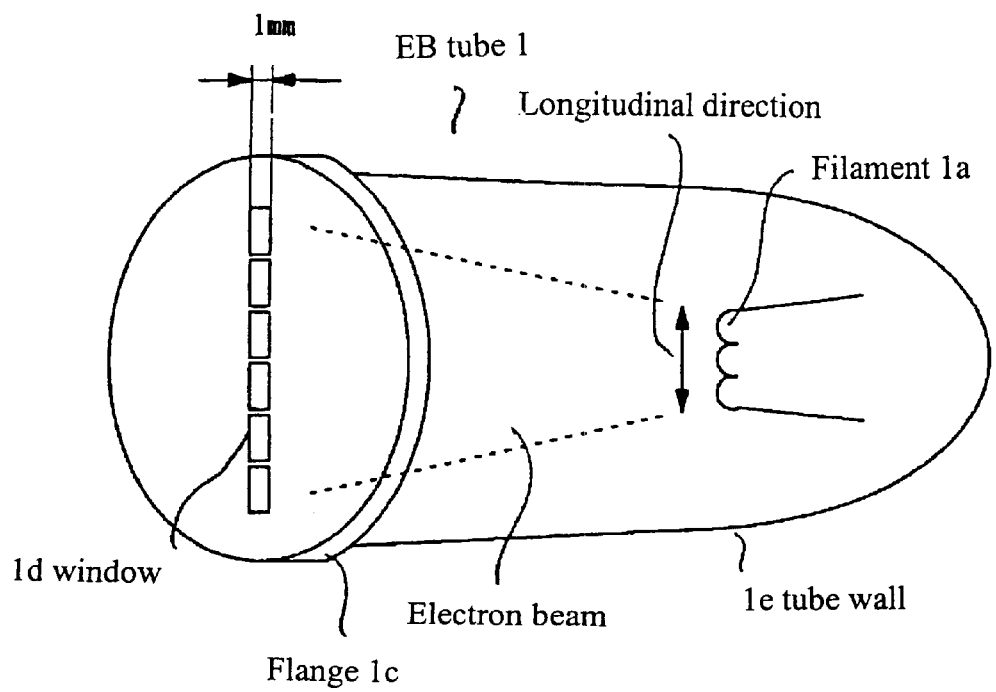
FIG. 8 is a diagram explaining the disposition of the window of a prior art EB tube.

FIG. 5 is a graph showing the output of EB tube 1 when the power of EB tube 1 is controlled by measuring the amount of electron beams via electron beam level measurement unit 11, as shown in FIG. 1, and the output when the power of EB tube 1 is controlled by detecting the tube current as shown in aforementioned prior art of FIG. 7.

This figure shows the results of measuring the current flowing through a workpiece when a workpiece is irradiated with electron beams from an EB tube. The abscissa in the diagram represents the elapsed time (minutes) following lighting of the EB tube while the ordinate represents the percentage of output of the EB tube, taking the output of the EB tube at the commencement of EB tube lighting as 100%. Furthermore, the circles represent the case in which the tube current is controlled so as to be constant while the triangles represent the case in which electron beam level measurement unit 11 in accordance with the present invention is mounted and used to control the power of EB tube 1.

As shown in the diagram, the output from the EB tube declines after the EB tube has been lit and reaches 100% after about 14 minutes when the tube current is controlled so as to be constant (round marks in the diagram). As mentioned above, this is believed to be due to the electrostatic effects resulting from change in the shape and direction of electron beams and change in the shape of the filament and nearby grid brought about by thermal expansion of these components upon heating of the filament following the lighting of the EB tube.

In contrast, the output of the EB tube is held virtually constant, as shown in the same diagram, when the power of the EB tube is controlled by mounting and using the electron beam level measurement unit 11 (triangles in the same diagram) in accordance with the present invention.

As indicated above, the amount of electron beams that are output from the EB tube is immediately held constant following lighting of the EB tube as a result of controlling the power of the EB tube through mounting of electron beam level measurement unit 11. Consequently, electron beam irradiation processing can be carried out without any time lag thereby enhancing the throughput.

Incidentally, the diameter of the EB tube is several centimeters (cm), which necessitates the processing of a workpiece by aligning a plurality of EB tubes on a plane when processing a large workpiece.

Figure 6:
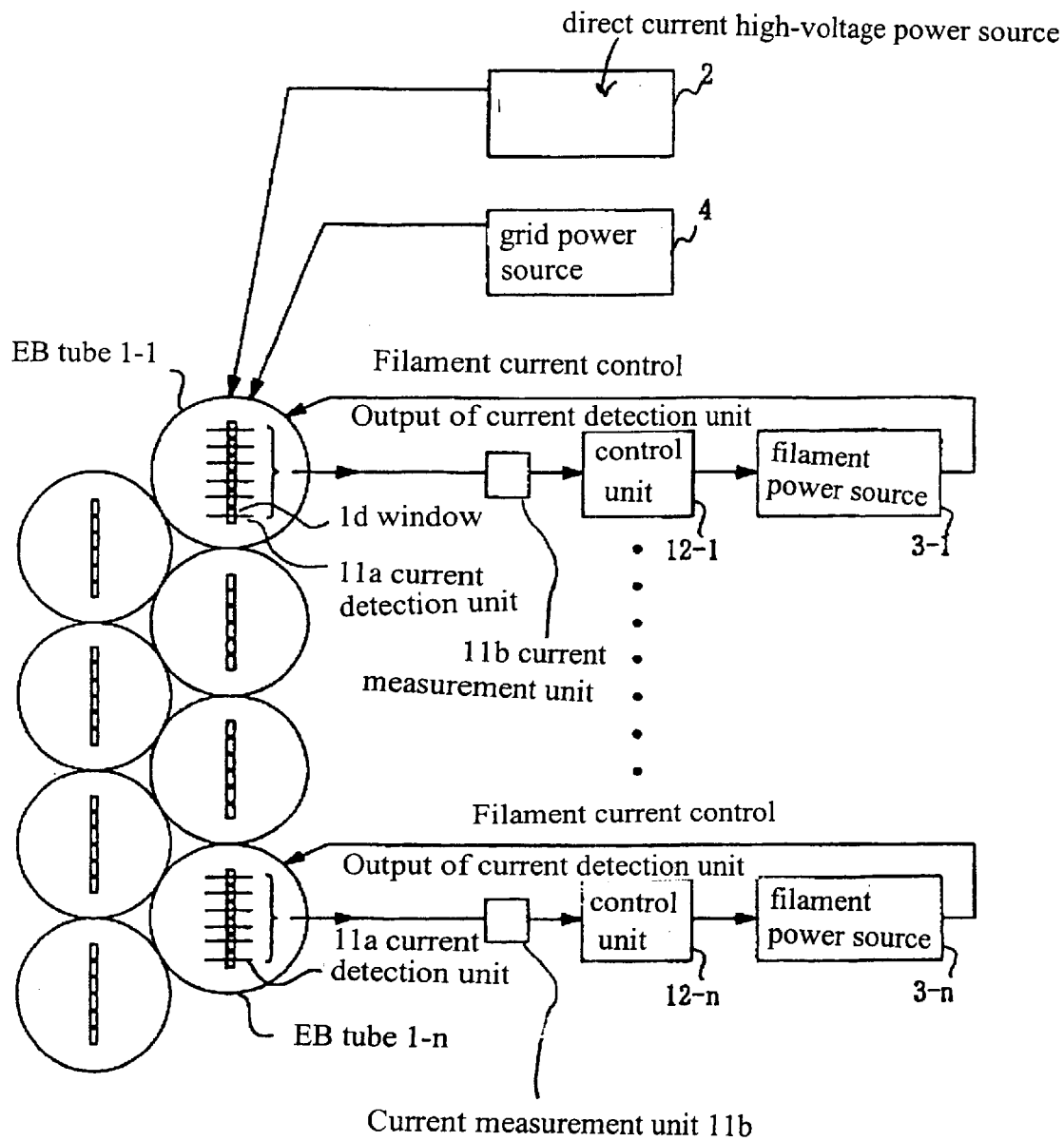
FIG. 6 is a schematic diagram showing an example of the structure of a control system in accordance with another embodiment of the present invention when using a plurality of EB tubes.

FIG. 6 is a schematic diagram showing an example of the structure of a control system when a plurality of EB tubes are used as mentioned above. Voltage is supplied from direct current high-voltage power source 2 and grid power source 4 to each EB tube 1-1 to 1-n, and filament power sources 3-1 to 3-n are mounted in each EB tube 1.

Aforementioned electron beam level measurement units 11 are mounted in each of the plurality of EB tubes as shown in FIG. 6, and their outputs are fed to each control unit 12-1 to 12-n.

Each control unit 12-1 to 12-n compares the measured current fed from aforementioned electron beam level measurement unit 11 with a pre-set current level inputted, and controls filament power sources 3-1 to 3-n so as to increase the filament current if the measured current level is smaller than the set current level. In addition, the filament current is decreased if the measured current level is greater than the set current level. By so doing, the amount of electron beams that are output from each EB tube 1 can be controlled so as to be constant.

Filament power source 3 is controlled based on the output of electron beam level measurement unit 11, and the amount of electron beams output from EB tube 1 is controlled in the manner explained above. However, the voltage applied to grid 1b of EB tube 1 may also be controlled in PWM to thereby control the amount of electron beams that is output from EB tube 1. Specifically, since EB tube 1 can effect ON/OFF control of the electron beam output by controlling the voltage that is applied to grid 1b, the current measured by electron beam level measurement unit 11 can be fed to a PWM controller and a pulse modulation signal (PWM signal) can be output which matches the measured current with the set current. The voltage applied to grid 1b of EB tube 1 would be controlled based on this output. As a result, the amount of electron beams output from EB tube 1 is subjected to PWM control so that the amount of electron beams output from EB tube 1 can be averaged and controlled to be constant just as in aforementioned embodiment.

The following effects can be attained in accordance with the present invention as explained above:

(1) The amount of electron beams radiated from an electron beam tube may be measured by disposing a current detection unit comprising a conductor or a semiconductor covered by an insulating film on the outside of the window of an electron beam tube, and measuring the current flowing through the current detection unit. The aforementioned insulating film functions as an energy barrier that permits a floating charge to be captured by the aforementioned conductor and the generation of current is obstructed.

As a result, the current can be stably detected based solely on the electrons that were output from the electron beam tube, thereby permitting the accurate measurement of electron beams that were output from the electron beam tube.

(2) A current detection unit comprising a conductor or a semiconductor covered by an insulating film, and a measurement unit for measuring the amount of electron beams comprising a current measurement unit that measures the current flowing through the current detection unit, are disposed on the outside of the window of an electron beam tube. The amount of electron beams output from the electron beam tube is controlled as a function of the current signal flowing through aforementioned current detection unit. Accordingly, the amount of electron beams output from the electron beam tube can be controlled without being affected by the floating charge. Furthermore, a constant level of electron beams can be stably output even if the shape or direction of electron beams within the electron tube should change since the amount of electron beams output from the electron beam tube is detected and controlled.

In accordance with the device and method of the present invention described above, the processed material could be irradiated with a set, prescribed amount of electron beams, and processing failure caused by insufficient or excessive irradiation could be prevented.

While various embodiments in accordance with the present invention have been shown and described, it is understood that the invention is not limited thereto. These embodiments may be changed, modified and further applied by those skilled in the art. Correspondingly, this invention is not limited to the details shown and described previously but also includes all such changes and modifications which are encompassed by the appended claims.

We claim:

1. A method of measuring amount of electron beams radiated from an electron beam tube with a window comprising the steps of:
   providing a current detection unit disposed on the outside of the window of the electron beam tube, the current detection unit having at least one of a conductor and a semiconductor covered by an insulating film; and
   measuring amount of electron beams radiated from the electron beam tube by measuring the current flowing through the current detection unit.

2. The method of claim 1, further comprising the step of controlling the amount of electron beams radiated from the electron beam tube based on the measured current flowing through the current detection unit.

3. The method of claim 2, wherein the step of controlling the amount of electron beams radiated from the electron beam tube is attained by controlling a power source unit to the electron beam tube.

4. The method of claim 3, further comprising the step of comparing the measured current flowing through the current detection unit to a set current level.

5. The method of claim 4, further comprising the step of increasing the output of the power source unit to the electron beam tube if the measured current is lower than the set current level.

6. The method of claim 4, further comprising the step of decreasing the output of the power source to the electron beam tube if the measured current is greater than the set current level.

7. An electron beam irradiation processing device comprising:
   an electron beam tube adapted to radiate electron beams to thereby irradiate processed material in treatment of the processed material, the electron beam tube having a window and an associated power-source unit that provides a power source to the electron beam tube; and
   a current detection unit disposed outside of the window of the electron beam tube, the current detection unit including at least one of a conductor and a semiconductor covered by an insulating film, and an electron beam level measurement unit having a current measurement unit that measures the current flowing through the current detection unit;
   wherein amount of electron beams output from the electron beam tube is controlled by controlling the power source unit as a function of the current flowing through the current detection unit.

8. The electron beam irradiation processing device of claim 7, further comprising a control unit adapted to compare the current measured by the current measurement unit to a set current level.

9. The electron beam irradiation processing device of claim 8, wherein said control unit is further adapted to increase the output of the power source unit if the measured current is lower than the set current level.

10. The electron beam irradiation processing device of claim 8, wherein said control unit is further adapted to decrease the output of the power source unit if the measured current is greater than the set current level.

* * * * *